(12) United States Patent
Sawara et al.

(10) Patent No.: US 7,808,252 B2
(45) Date of Patent: Oct. 5, 2010

(54) MEASUREMENT APPARATUS AND MEASUREMENT METHOD

(75) Inventors: Atsuo Sawara, Tokyo (JP); Yuichi Miyaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 342 days.

(21) Appl. No.: 11/955,390

(22) Filed: Dec. 13, 2007

(65) Prior Publication Data

US 2009/0261807 A1 Oct. 22, 2009

(51) Int. Cl.
G01R 27/28 (2006.01)
G01R 31/02 (2006.01)
(52) U.S. Cl. .................. 324/615; 324/537; 375/226
(58) Field of Classification Search .......... 324/76.12, 324/537, 615; 375/226
See application file for complete search history.

(56) References Cited

U.S. PATENT DOCUMENTS

| 7,054,358 | B2* | 5/2006 | Yamaguchi et al. | 375/226 |
| 7,136,773 | B2* | 11/2006 | Ishida et al. | 375/226 |
| 7,305,025 | B2* | 12/2007 | Yamaguchi et al. | 375/226 |
| 7,397,847 | B2* | 7/2008 | Ishida et al. | 375/224 |
| 7,558,991 | B2* | 7/2009 | Mattes et al. | 375/226 |
| 2005/0129104 | A1* | 6/2005 | Ishida et al. | 375/224 |
| 2005/0149784 | A1* | 7/2005 | Ishida et al. | 714/724 |
| 2006/0291548 | A1* | 12/2006 | Mattes et al. | 375/224 |

FOREIGN PATENT DOCUMENTS

| JP | 05-235718 | 9/1993 |
| JP | 2000-269795 | 9/2000 |
| JP | 2002-189061 | 7/2002 |
| JP | 2005-181325 | 7/2005 |
| JP | 2006-041640 | 2/2006 |

* cited by examiner

*Primary Examiner*—Timothy J Dole
(74) *Attorney, Agent, or Firm*—Osha Liang LLP

(57) ABSTRACT

Provided is a test apparatus for testing the jitter tolerance of a device under test which receives a data signal and a strobe signal indicating the timing at which the data signal should be received, and acquires the data signal at the timing indicated by the strobe signal, including a signal generating section which generates the data signal and the strobe signal to be supplied to the device under test, a jitter applying section which applies a combinational jitter obtained by combining a data jitter which should be tolerated for the data signal and a strobe jitter which should be tolerated for the strobe signal to the data signal or the strobe signal, and a signal supplying section which supplies the data signal and the strobe signal, to one of which the combinational jitter has been applied, to the device under test.

7 Claims, 6 Drawing Sheets

MEASUREMENT APPARATUS AND MEASUREMENT METHOD

BACKGROUND

1. Technical Field

The present invention relates to a test apparatus, a test method, a measurement apparatus, and a measurement method. Particularly, the present invention relates to a test apparatus and a test method for testing jitter tolerance, and to a measurement apparatus and a measurement method for measuring jitter transfer characteristic.

2. Description of the Related Art

Devices such as semiconductor devices perform data transfer with other devices. As one example of the manner for data transfer between devices, there is known a source synchronous manner, in which a data signal and a strobe single indicating the timing at which the data signal should be received are transferred in parallel.

Signals transferred between devices might include a jitter. The jitter included in the signals transferred between devices influences the quality of the data transfer. Accordingly, for example, device manufacturers who handle the devices for performing high rate transfer with other devices test the jitter tolerance of the devices using a test apparatus before shipment to guarantee the quality of the devices.

Some devices that employ the source synchronous manner are given a jitter tolerance for the data signal and a jitter tolerance for the strobe signal separately in the specs. In testing such a device, the test apparatus has to separately perform the test on the jitter tolerance for the data signal and the test on the jitter tolerance for the strobe signal.

Further, devices that perform high rate transfer with other devices are given a defined value in the specs, that is smaller than a predetermined value, as the jitter to be included in their output signal. Hence, there has been a demand for a measurement apparatus which can measure what level of jitter is included in the signal output from the devices, in order that such jitter definition can be guaranteed.

SUMMARY

Therefore, it is an object of an aspect of the innovations herein to provide a test apparatus, a test method, a measurement apparatus, and a measurement method, which are capable of overcoming the above drawbacks accompanying the related art. The above and other objects can be achieved by combinations described in the independent claims. The dependent claims define further advantageous and exemplary combinations of the innovations herein.

To achieve the above object, according to a first aspect related to the innovations herein, provided is one exemplary test apparatus for testing a jitter tolerance of a device under test which receives a data signal and a strobe signal indicating a timing at which the data signal should be received, and acquires the data signal at the timing indicated by the strobe signal, the test apparatus including: a signal generating section which generates the data signal and the strobe signal, which are to be supplied to the device under test; a jitter applying section which applies a combinational jitter obtained by combining a data jitter which should be tolerated for the data signal and a strobe jitter which should be tolerated for the strobe signal, to the data signal or the strobe signal; and a signal supplying section which supplies the data signal and the strobe signal, to one of which the combinational jitter has been applied, to the device under test.

According to a second aspect related to the innovations herein, provided is one exemplary test method for testing a jitter tolerance of a device under test which receives a data signal and a strobe signal indicating a timing at which the data signal should be received, and acquires the data signal at the timing indicated by the strobe signal, the test method including: generating the data signal and the strobe signal which are to be supplied to the device under test; applying a combinational jitter obtained by combining a data jitter which should be tolerated for the data signal and a strobe jitter which should be tolerated for the strobe signal, to the data signal or the strobe signal; and supplying the data signal or the strobe signal, to one of which the combinational jitter has been applied, to the device under test.

According to a third aspect related to the innovations herein, provided is one exemplary measurement apparatus for measuring a jitter transfer characteristic of a device under test, including: a signal creating section which creates a measurement signal including a combinational jitter obtained by combining a plurality of jitters having different frequency components from each other, and supplies the measurement signal to the device under test; and a measuring section which receives a response signal which the device under test outputs in response to the measurement signal, and measures a jitter transfer characteristic for the frequency component corresponding to each of the plurality of jitters.

According to a fourth aspect related to the innovations herein, provided is one exemplary measurement method for measuring a jitter transfer characteristic of a device under test, including: creating a measurement signal including a combinational jitter obtained by combining a plurality of jitters having different frequency components from each other, and supplying the measurement signal to the device under test; and receiving a response signal which the device under test outputs in response to the measurement signal, and measuring a jitter transfer characteristic for the frequency component corresponding to each of the plurality of jitters.

The summary clause does not necessarily describe all necessary features of the embodiments of the present invention. The present invention may also be a sub-combination of the features described above.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
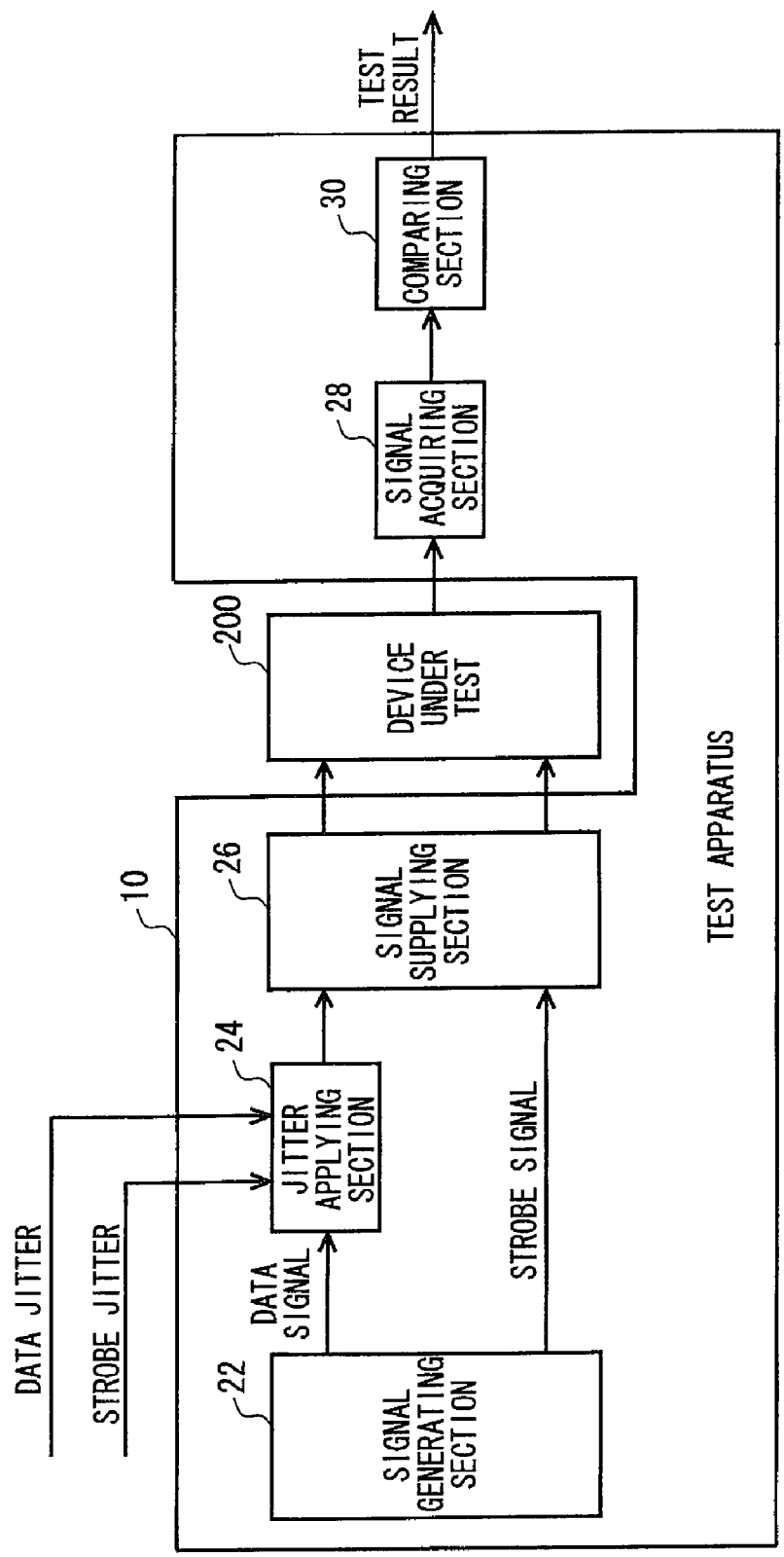
FIG. 1 shows the configuration of a test apparatus 10 according to the present embodiment, together with a device under test 200.

FIG. 1 shows the configuration of a test apparatus 10 according to the present embodiment, together with a device under test 200. In performing data transfer with other devices, the device under test 200 receives a data signal and a strobe signal indicating the timing at which the data signal should be received, from any other devices. Then, the device under test 200 acquires the data signal at the timing designated by the strobe signal.

The test apparatus 10 tests the jitter tolerance of such a device under test 200. That is, for example, the test apparatus 10 supplies the device under test 200 with a data signal and strobe signal to which a jitter is applied, and judges whether or not the device under test 200 can output an expected value.

The test apparatus 10 includes a signal generating section 22, a jitter applying section 24, a signal supplying section 26, a signal acquiring section 28, and a comparing section 30. The signal generating section 22 generates a data signal and a strobe signal to be supplied to the device under test 200. The signal generating section 22 may, for example, output a data signal having a waveform corresponding to a test pattern for testing the device under test 200.

The jitter applying section 24 applies a combinational jitter obtained by combining a data jitter that should be tolerated for the data signal and a strobe jitter that should be tolerated for the strobe signal, to the data signal or the strobe signal. The jitter applying section 24 may, for example, apply a combinational data obtained by combining the maximum data jitter that should be tolerated in the device under test 200 and the maximum strobe jitter that should be tolerated in the device under test 200, to the data signal or the strobe signal. Note that the jitter applying section 24 is configured to apply the combinational jitter to the data signal in FIG. 1, but may be configured to apply the combinational jitter to the strobe signal.

The jitter applying section 24 may, for example, digitally add the data jitter and the strobe jitter to generate the combinational jitter. Further, as will be described in detail later with reference to FIG. 2 and FIG. 3, the jitter applying section 24 may apply the data jitter and the strobe jitter to either one signal (the data signal or the strobe signal) through different delay circuits for the respective jitters.

The signal supplying section 26 supplies the device under test 200 with the data signal and the strobe signal, to either one of which the combinational jitter has been applied. The signal supplying section 26 may, for example, include a data signal driver circuit for supplying the data signal to a data input terminal of the device under test 200, and a strobe driver circuit for supplying the strobe signal to a strobe input terminal of the device under test 200.

The signal acquiring section 28 acquires a response signal output from the device under test 200 in response to the data signal and strobe signal supplied thereto. The signal acquiring section 28 may, for example, include a level comparator circuit for converting the response signal to a logical level, and a timing comparator circuit for acquiring the logic of the response signal at a timing designated by, for example, a test program.

The comparing section 30 compares the logic of the response signal acquired by the signal acquiring section 28 with an expectation value. Then, the comparing section 30 outputs the result of comparison between the logic of the response signal and the expectation value.

The test apparatus 10 having this configuration can test the jitter tolerance of the device under test 200 by supplying the device under test 200 with, as test signals, a data signal and strobe signal to which a jitter is applied. Further, this test apparatus 10 can test the jitter tolerance for the data signal and the jitter tolerance for the strobe signal not separately but collectively. Furthermore, the test apparatus 10 can have a simple internal structure because there is only the need of applying a jitter to either one of the data signal and the strobe signal, and thus can shorten the time required for the test.

Figure 2:
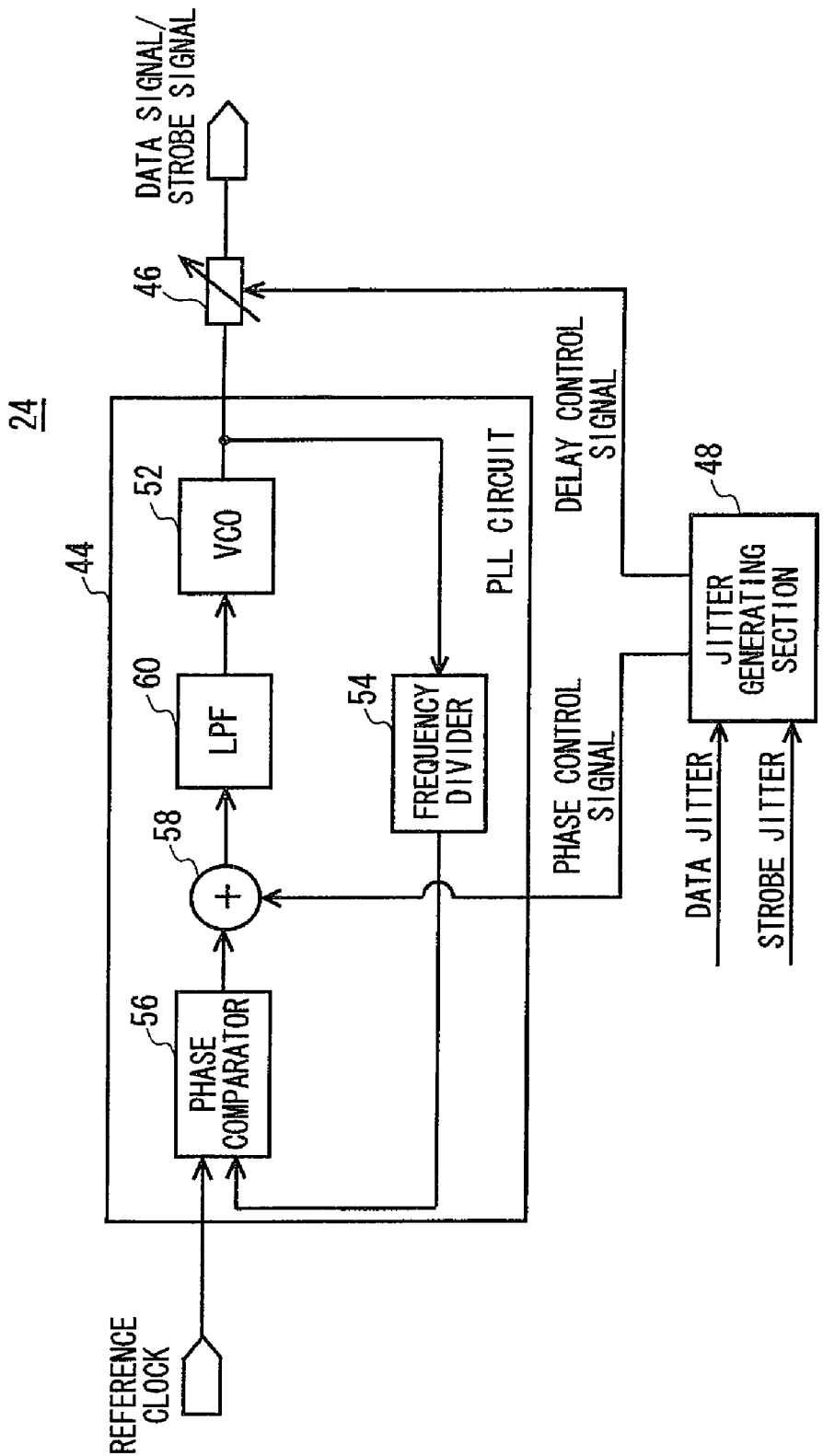
FIG. 2 shows a first example of the configuration of a jitter applying section 24 according to the present embodiment.

FIG. 2 shows a first example of the configuration of the jitter applying section 24 according to the present embodiment. The jitter applying section 24 according to the present example includes a PLL circuit 44, a variable delay circuit 46, and a jitter generating section 48.

The PLL circuit 44 outputs a shifted clock obtained by shifting a reference clock by a phase corresponding to a phase control signal input thereto from the jitter generating section 48. The PLL circuit 44 may, for example, output a shifted clock obtained by shifting a signal synchronous with the reference clock and having a frequency N times that of the reference clock (N being a positive integer), by a phase indicated by the phase control signal.

The PLL circuit 44 may, for example, include a VCO 52, a frequency divider 54, a phase comparator 56, an adder 58, and a LPF 60. The VCO 52 outputs a signal having a frequency according to a control voltage supplied thereto. The frequency divider 54 outputs a divisional frequency signal having a frequency 1/N times that of the signal output from the VCO 52 (N being an integer), which is obtained by frequency division. The phase comparator 56 detects any phase difference between the reference clock supplied thereto and the divisional frequency signal output from the frequency divider 54, and outputs a signal representing a voltage corresponding to the detected phase difference.

The adder 58 receives a phase control signal having a voltage corresponding to the amount of the jitter to be applied, from the jitter generating section 48. The adder 58 adds the voltage of the output signal from the phase comparator 56 and the voltage of the phase control signal. The LPF 60 outputs a control voltage obtained by smoothing the voltage output from the adder 58, and supplies it to the VCO 52.

Then, the PLL circuit 44 having this configuration outputs the signal output from the VCO 52 as a shifted clock. In this manner, the PLL circuit 44 can output a shifted clock obtained by shifting the reference clock by a phase corresponding to the phase control signal.

Note that the PLL circuit 44 may be provided in the signal generating section 22. Further, in a case where the jitter applying section 24 applies a jitter to a data signal, the signal generating section 22 may include a waveform shaper, which, as disposed between the PLL circuit 44 and the variable delay circuit 46, shapes the waveform of the data signal so as to be synchronous with the shifted clock and so as to correspond to the test pattern.

The variable delay circuit 46 delays the shifted clock by a delay amount corresponding to a delay control signal supplied from the jitter generating section 48, and outputs the delayed shifted clock as a data signal or a strobe signal to which a combinational jitter is applied. The variable delay circuit 46 may, for example, include a buffer circuit and a variable capacitance diode provided in parallel with the output terminal of the buffer circuit. Thus, the variable delay circuit 46 may be such a circuit as delaying any signal that passes through the buffer circuit, by varying the capacitance of the variable capacitance diode according to the delay control signal.

The jitter generating section 48 supplies a phase control signal corresponding to one of the data jitter and the strobe jitter to the PLL circuit 44, and supplies a delay control signal corresponding to the other of the data jitter and the strobe jitter to the variable delay circuit 46. That is, the jitter generating section 48 may, for example, supply a phase control signal corresponding to the data jitter to the PLL circuit 44, and supply a delay control signal corresponding to the strobe jitter to the variable delay circuit 46. Instead of this, the jitter generating section 48 may supply a phase control signal corresponding to the strobe jitter to the PLL circuit 44, and supply a delay control signal corresponding to the data jitter to the variable delay circuit 46.

The jitter applying section 24 according to the present example as above can apply a combinational jitter obtained by combining the data jitter and the strobe jitter to either the data signal or the strobe signal. Hence, the test apparatus 10 can perform a test equivalent to a test where the data jitter and the strobe jitter are separately included in the data signal and the strobe signal respectively, by applying a jitter to either one of the data signal and the strobe signal.

Figure 3:
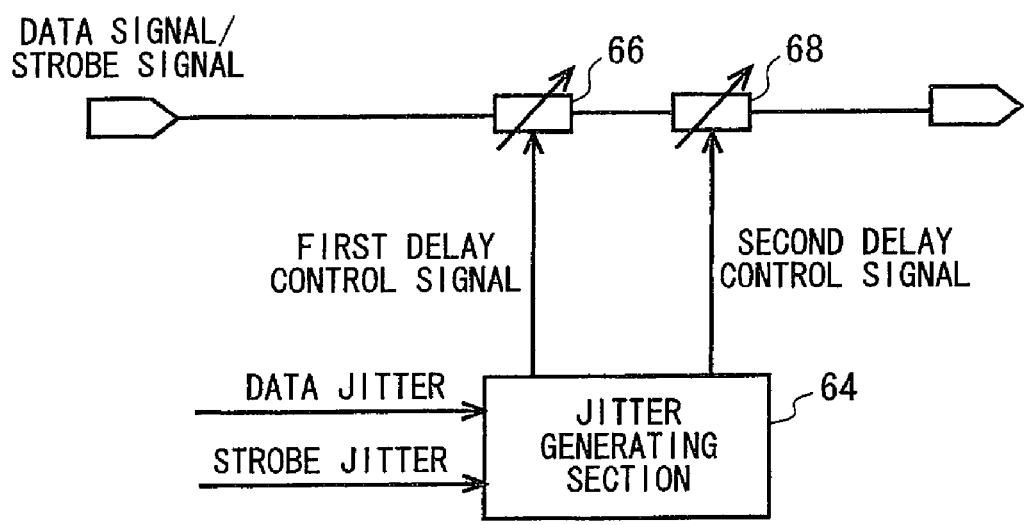
FIG. 3 shows a second example of the configuration of the jitter applying section 24 according to the present embodiment.

FIG. 3 shows a second example of the configuration of the jitter applying section 24 according to the present embodiment. The jitter applying section 24 according to the present example includes a jitter generating section 64, a first variable delay circuit 66, and a second variable delay circuit 68.

The jitter generating section 64 outputs a first jitter control signal and a second jitter control signal each corresponding to either the data jitter or the strobe jitter, which is different from the jitter to which the other control signal corresponds. The jitter generating section 64 may, for example, output a first jitter control signal corresponding to the data jitter and a second jitter control signal corresponding to the strobe jitter. Instead of this, the jitter generating section 64 may output a first jitter control signal corresponding to the strobe jitter and a second jitter control signal corresponding to the data jitter.

The first variable delay circuit 66 receives a data signal or a strobe signal from the signal generating section 22. Then, the first variable delay circuit 66 delays the received data signal or strobe signal by a delay amount corresponding to the first jitter control signal, and outputs the obtained delayed signal.

The second variable delay circuit 68 receives the signal output from the first variable delay circuit 66. Then, the second variable delay circuit 68 delays the received signal by a delay amount corresponding to the second jitter control signal and outputs the obtained signal as the data signal or the strobe signal to which a combinational jitter is applied. The jitter applying section 24 according to the present example as above can apply a combinational jitter obtained by combining the data jitter and the strobe jitter to either the data signal or the strobe signal.

Figure 4:
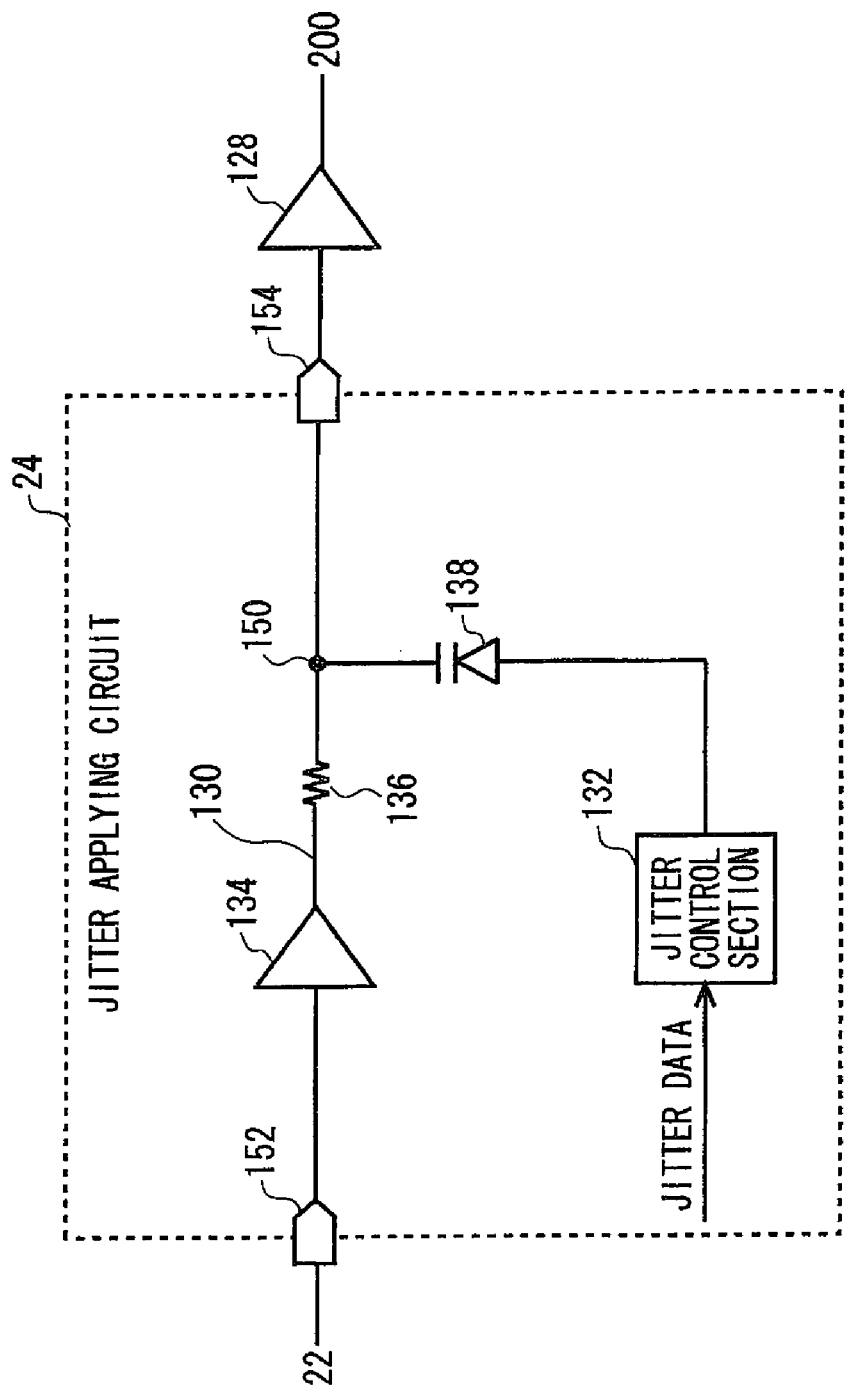
FIG. 4 shows a third example of the configuration of the jitter applying section 24 according to the present embodiment.

FIG. 4 shows a third example of the configuration of the jitter applying circuit 24 according to the present embodiment, together with a driver circuit 128 as one example of the signal supplying section 26. The jitter applying circuit 24 includes a signal transmission path 130, a jitter control section 132, a buffer circuit 134, a serial resistor 136, and a variable capacitance diode 138.

The jitter applying circuit 24 receives a data signal or a strobe signal output from the signal generating section 22 through an input terminal 152 as the objective signal to which a jitter is to be applied, and applies a jitter to the received signal. Then, the jitter applying circuit 24 supplies the signal to which the jitter is applied to the driver circuit 128 through an output terminal 154.

The driver circuit 128 outputs an H logic voltage (for example, VDD) in a case where the voltage of the signal supplied thereto is equal to or higher than a threshold voltage $V_{TH}$. The driver circuit 128 outputs an L logic voltage (for example, VSS) in a case where the voltage of the supplied signal is lower than the threshold voltage $V_{TH}$.

The signal transmission path 130 transmits the signal from the input terminal 152 to the output terminal 154. The signal transmission path 130 has a connection node 150 between the input terminal 152 and the output terminal 154.

The jitter control section 132 outputs, from its output terminal, a jitter control voltage corresponding to the jitter to be superimposed on the signal transmitted through the signal transmission path 130. The jitter control section 132 may, for example, be supplied with jitter data representing the jitter to be applied, and output a jitter control voltage obtained by converting the supplied jitter data from digital to analog.

The buffer circuit 134 is connected in series on the signal transmission path 130 at a location closer to the input terminal 152 than the connection node 150 is. That is, the buffer circuit 134 receives the signal input through the input terminal 152.

Then, the buffer circuit 134 outputs a voltage corresponding to the logic of the received signal. For example, the buffer circuit 134 outputs an H logic voltage in a case where the voltage of the received signal is equal to or higher than a threshold voltage $V_{TH}$. Further, the driver circuit 128 outputs an L logic voltage in a case where the voltage of the received signal is lower than the threshold voltage $V_{TH}$. Instead, the buffer circuit 134 may, for example, output an H logic voltage in a case where the voltage of the received signal is equal to or higher than an H-side threshold voltage $V_{TH}$, and output an L logic voltage in a case where the voltage of the received signal is lower than an L-side threshold voltage $V_{TL}$ ($V_{TL} < V_{TL}$). Even if the supplied signal has an obscure edge, such a buffer circuit 134 can convert the signal to a signal having a steep edge, without shifting (for example, without delaying) the timing at which logic switch takes place (the timing at which the signal becomes the threshold voltage $V_{TH}$).

The serial resistor 136 is connected on the signal transmission path 130 between the buffer circuit 134 and the connection node 150 in series. That is, the serial resistor 136 has its one terminal connected to the output terminal of the buffer circuit 134 and has its other terminal connected to the connection node 150.

The variable capacitance diode 138 is provided between the connection node 150 on the signal transmission path 130 and the output terminal of the jitter control section 132. The capacitance of the variable capacitance diode 138 changes according to the jitter control voltage output from the jitter control section 132. The variable capacitance diode 138 may be, for example, a varicap diode whose capacitance changes according to a reverse voltage (a voltage higher at a cathode than at an anode). Such a serial resistor 136 and a variable capacitance diode 138 can generate, at the connection node 150, such a voltage as obtained by applying low-pass filtering to the voltage output from the buffer circuit 134.

The buffer circuit 134, the serial resistor 136, and the variable capacitance diode 138 as above function as a variable delay circuit which delays the timing at which the logic of the signal supplied thereto is switched (the timing at which the signal becomes the threshold voltage $V_{TH}$). The delay amount of the signal to be delayed by the buffer circuit 134, the serial resistor 136, and the variable capacitance diode 138 changes according to the capacitance of the variable capacitance diode 138. The capacitance of the variable capacitance diode 138 changes according to the jitter control voltage supplied from the jitter control section 132. Hence, the delay amount of the signal to be delayed by the buffer circuit 134, the serial resistor 136, and the variable capacitance diode 138 changes according to the jitter control voltage supplied from the jitter control section 132.

The variable capacitance diode 138 may, for example, have its anode connected to the output terminal of the jitter control section 132 and have its cathode connected to the connection node 150. In this case, the jitter control section 132 outputs a jitter control voltage which is within a range lower than the lowest voltage output from the buffer circuit 134 (the lower one of the H logic voltage and the L logic voltage). This causes a reverse voltage to be applied across the anode and cathode of the variable capacitance diode 138, which thus changes its capacitance according to the jitter control voltage.

Instead, the variable capacitance diode 138 may have its cathode connected to the output terminal of the jitter control section 132 and have its anode connected to the connection node 150. In this case, the jitter control section 132 outputs a jitter control voltage which is within a range higher than the highest voltage output from the buffer circuit 134 (the higher one of the H logic voltage and the L logic voltage). This causes a reverse voltage to be applied across the anode and cathode of the variable capacitance diode 138, which thus changes its capacitance according to the jitter control voltage.

Note that it is preferred that the jitter control section 132 output a jitter control voltage which would give the variable capacitance diode 138 a reverse voltage that is sufficiently larger than the potential difference between the H logic voltage and the L logic voltage. This enables the jitter control section 132 to allow a smaller fluctuation, due to the fluctuation of the logic of the signal transmitted through the signal transmission path 130, of the capacitance of the variable capacitance diode 138.

When the connection node 150 is seen from the output terminal of the jitter control section 132, the serial resistor 136 and the variable capacitance diode 138 function as a high-pass filter. Accordingly, it is preferred that the jitter control section 132 output a jitter control voltage which fluctuates at a sufficiently low frequency as compared with the frequency of the signal transmitted through the signal transmission path 130. Hence, the jitter control section 132 can have the serial resistor 136 and the variable capacitance diode 138 constitute a high-pass filter to eliminate any noise that would mix into the signal transmitted through the signal transmission path 130 as influenced by the fluctuation of the jitter control voltage.

Figure 5:
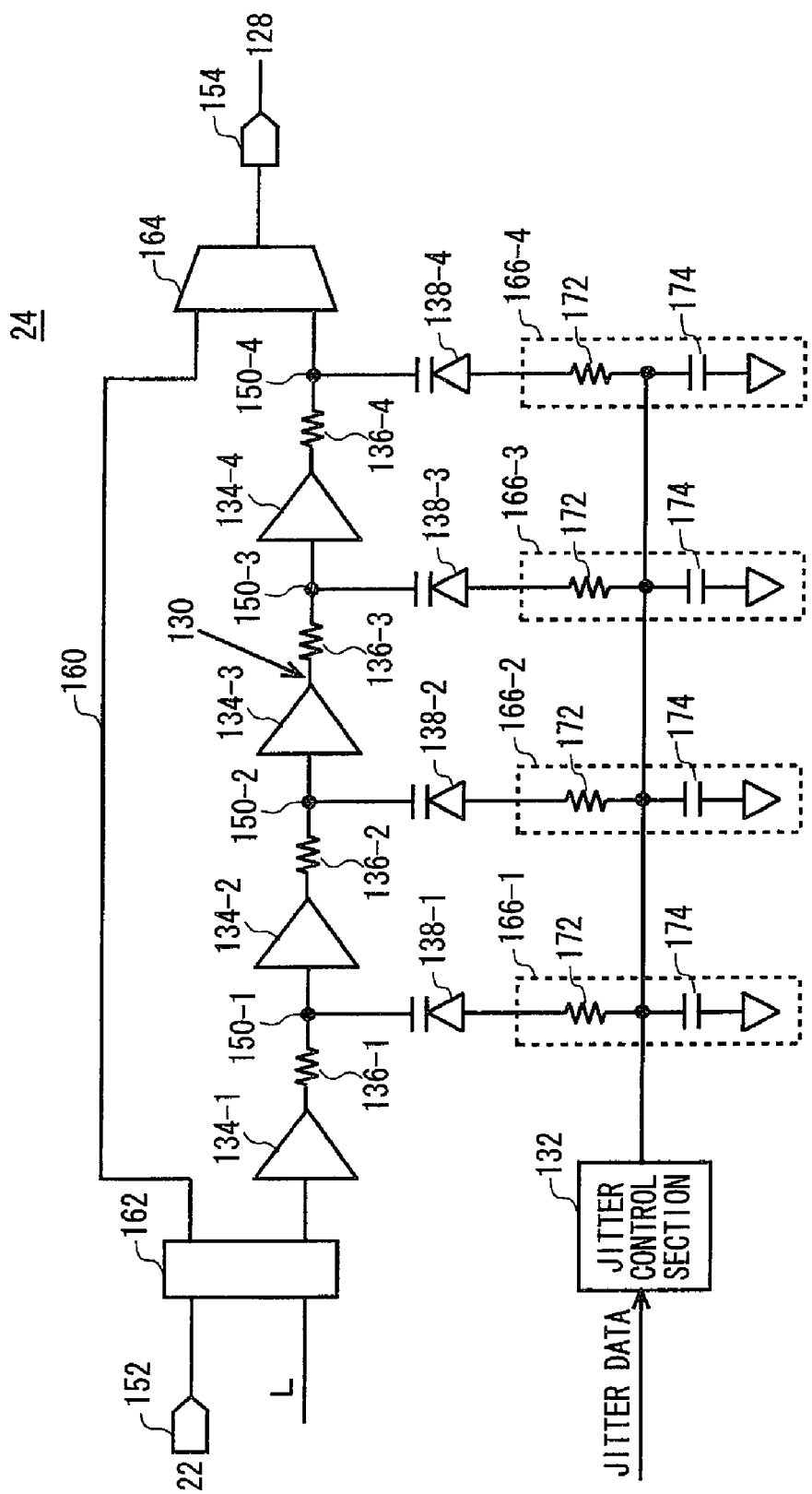
FIG. 5 shows a fourth example of the configuration of the jitter applying section 24 according to the present embodiment.

FIG. 5 shows a fourth example of the configuration of the jitter applying circuit 24 according to the present embodiment. The jitter applying circuit 24 according to the present example has generally the same configuration and functions as those of the jitter applying circuit 24 according to the third example shown in FIG. 4, so any components that have generally the same configuration and function as those of the components included in the jitter applying circuit 24 shown in FIG. 4 will be denoted by the same reference numerals, and explanation for such components will be omitted below except any differences.

The jitter applying circuit 24 according to the present example includes a signal transmission path 130, a jitter control section 132, a plurality of buffer circuits 134, a plurality of serial resistors 136, a plurality of variable capacitance diodes 138, a bypass transmission path 160, an input-side selecting section 162, an output-side selecting section 164, and a plurality of noise eliminating sections 166. In the present example, the signal transmission path 130 has a plurality of connection nodes 150 (for example, connection nodes 150-1 to 150-4).

The plurality of buffer circuits 134 (for example, buffer circuits 134-1 to 134-4) are provided correspondingly to the plurality of connection nodes 150 respectively. The plurality of buffer circuits 134 are each connected on the signal transmission path 130 in series at a location which is closer to the input terminal 152 than the corresponding connection node 150 is, and which is closer to the output terminal 154 than another connection node 150 that is closer to the input terminal 152 than the corresponding connection node 150 is.

That is, the first buffer circuit 134-1 is provided between the input terminal 152 and the first connection node 150-1. The second buffer circuit 134-2 is provided between the first connection node 150-1 and the second connection node 150-2. And the m-th buffer circuit 134-m (m is an integer equal to or larger than 2; this is the same hereinafter) is provided between the (m-1)th connection node 150-(m-1) and the m-th connection node 150-m.

The plurality of serial resistors 136 (for example, serial resistors 136-1 to 136-4) are provided correspondingly to the plurality of connection nodes 150 respectively. The plurality of serial resistors 136 are each connected on the signal transmission path 130 in series between the corresponding buffer circuit 134 and the corresponding connection node 150.

That is, the first serial resistor 136-1 has its one terminal connected to the output terminal of the first buffer circuit 134-1 and has its other terminal connected to the first connection node 150-1. The second serial resistor 136-2 has its one terminal connected to the output terminal of the second buffer circuit 134-2 and has its other terminal connected to the second connection node 150-2. Then, the m-th serial resistor 136-2 has its one terminal connected to the output terminal of the m-th buffer circuit 134-m and has its other terminal connected to the m-th connection node 150-m.

The plurality of variable capacitance diodes 138 (for example, variable capacitance diodes 138-1 to 138-4) are provided correspondingly to the plurality of connection nodes 150 on the signal transmission path 130 respectively. The plurality of variable capacitance diodes 138 are each provided between the corresponding connection node 150 and the output terminal of the jitter control section 132. Then, the plurality of variable capacitance diodes 138 change their capacitance according to a jitter control voltage output from the jitter control section 132.

The jitter applying circuit 24 according to the present example has plural sets of the buffer circuit 134, the serial resistor 136, and the variable capacitance diode 138 on the signal transmission path 130. Each of the plural sets of the buffer circuit 134, the serial resistor 136, and the variable capacitance diode 138 that respectively correspond to the plurality of connection nodes 150 functions as a variable delay circuit which delays the timing at which the logic of the signal supplied thereto is switched (the timing at which the signal becomes the threshold voltage $V_{TH}$). That is, the plural sets of the buffer circuit 134, the serial resistor 136, and the variable capacitance diode 138 function as a plurality of variable delay circuits connected in series on the signal transmission path 130. Hence, the jitter applying circuit 24 according to the present example as above can apply a larger jitter to the signal input to the input terminal 152.

The bypass transmission path 160 transmits a signal from the input terminal 152 to the output terminal 154. The bypass transmission path 160 may, for example, have a delay of a predetermined amount.

The input-side selecting section 162 selects which of the signal transmission path 130 and the bypass transmission path 160 the signal input via the input terminal 152 is let to pass through to be output. The output-side selecting section 164 selects either the signal through the signal transmission path 130 or that through the bypass transmission path 160, and outputs it to the outside via the output terminal 154. The output-side selecting section 164 selects either the signal through the signal transmission path 130 or that through the bypass transmission path 160 in synchronization with the selection by the input-side selecting section 162. In a case where there is no need of applying a jitter, the jitter applying circuit 24 according to the present example can output the signal input via the input terminal 152 to the output terminal 154 without letting the signal pass through the buffer circuit 134, the serial resistor 136, and the variable capacitance diode 138, which serve to apply a jitter.

Further, for example, in a case where the input-side selecting section 162 is to let the input signal pass through either one of the signal transmission path 130 and the bypass transmission path 160, it may input a predetermined signal value (for example, an L logic voltage, an H logic voltage, a ground voltage, etc.) to the other of the signal transmission path 130 and the bypass transmission path 160. This allows the input-side selecting section 162 to keep a constant potential across the signal transmission path 130 or the bypass transmission path 160 through which the signal is not let to pass and thereby to suppress occurrence of noise.

Further, for example, in a case where the input-side selecting section 162 selects neither the signal transmission path 130 nor the bypass transmission path 160 to let the signal pass through, it may input predetermined signal values to both the signal transmission path 130 and the bypass transmission path 160. This allows the input-side selecting section 162 to keep constant potentials across both the signal transmission path 130 and the bypass transmission path 160 in a case where no signal is let therethrough both, and to suppress occurrence of noise.

The plurality of noise eliminating sections 166 are provided correspondingly to the plurality of variable capacitance diodes 138 respectively. The plurality of noise eliminating sections 166 each eliminate any noise that is to occur at the output terminal of the jitter control section 132 as the signal transmitted through the signal transmission path 130 passes by each variable capacitance diode 138.

That is, the variable capacitance diode 138 forwards the high-frequency component of the signal transmitted through the signal transmission path 130 toward the output terminal of the jitter control section 132. Each of the plurality of noise eliminating sections 166 releases the high-frequency component forwarded by the corresponding variable capacitance diode 138 to, for example, the ground. Hence, the jitter applying circuit 24 according to the present example can eliminate the high-frequency signal that has passed through the variable capacitance diode 138 without almost passing the component on to other circuits (for example, the other variable capacitance diodes 138, etc.), and thus can precisely apply a jitter.

Each of the plurality of noise eliminating sections 166 may include, for example, a noise eliminating resistor 172, and a noise eliminating capacitor 174. The noise eliminating resistor 172 is connected between the corresponding variable capacitance diode 138 and the output terminal of the jitter control section 132. The noise eliminating capacitor 174 is connected between the output terminal of the jitter control section 132 and a reference potential (for example, the ground). Such a noise eliminating section 166 functions as a low-pass filter. That is, the noise eliminating section 166 can function as a low-pass filter that eliminates any noise that occurs under the influence of the high-frequency component that has passed through the variable capacitance diode 138.

Figure 6:
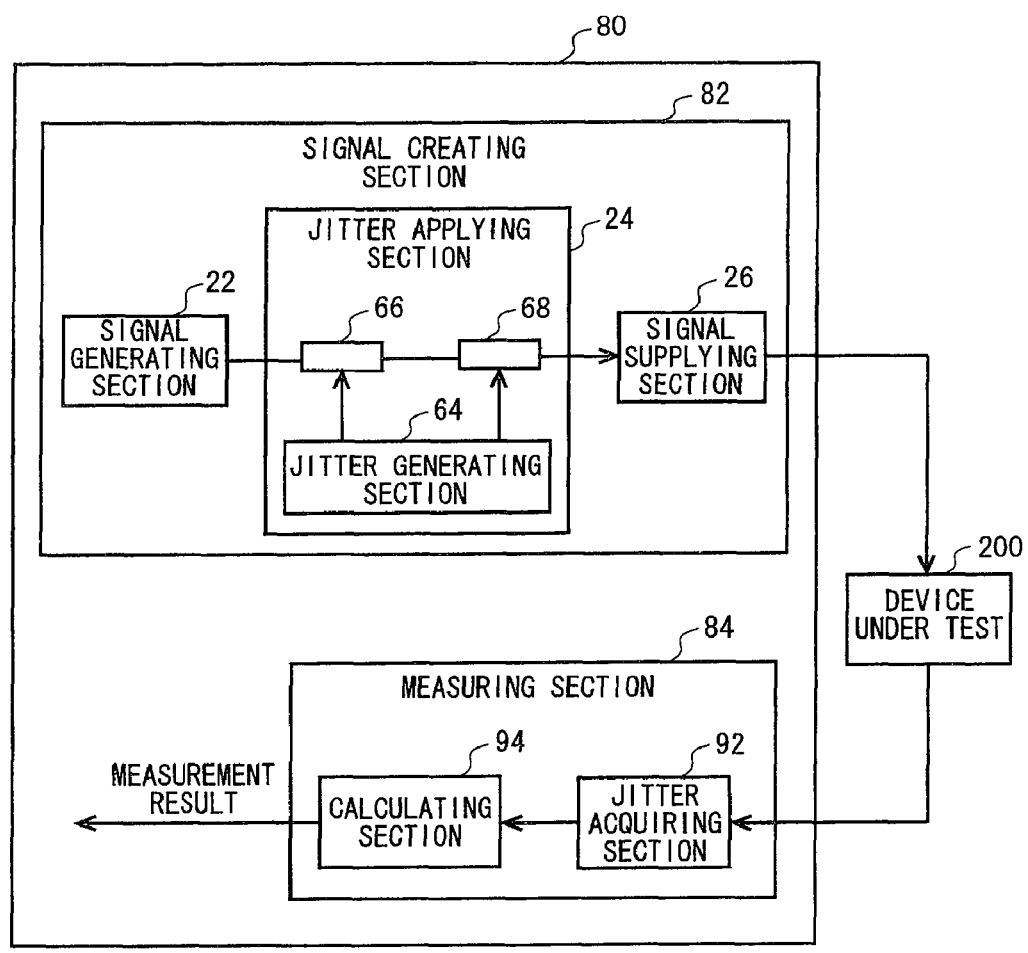
FIG. 6 shows the configuration of a measurement apparatus 80 according to the present embodiment, together with a device under test 200.

FIG. 6 shows the configuration of a measurement apparatus 80 according to the present embodiment, together with a device under test 200. Since the measurement apparatus 80 shown in FIG. 6 has generally the same configuration and functions as those of the test apparatus 10 shown in FIG. 1, those members that have generally the same configuration and function as those of the members of the test apparatus 10 are denoted in FIG. 6 by the same reference numerals as in FIG. 1, and explanation for such members will be omitted below except any differences.

The measurement apparatus 80 measures the jitter transfer characteristic of the device under test 200. The measurement apparatus 80 includes a signal creating section 82 and a measuring section 84.

The signal creating section 82 creates a measurement signal including a combinational jitter obtained by combining a plurality of jitters having different frequency components from each other, and supplies the signal to the device under test 200. The signal creating section 82 may, for example, include a signal generating section 22, a jitter applying section 24, and a signal supplying section 26. The signal generating section 22, for example, outputs a measurement signal having a waveform corresponding to a predetermined logic pattern.

The jitter applying section 24 applies a combinational jitter obtained by combining a plurality of jitters having different frequency components from each other, to the measurement signal output from the signal generating section 22. The jitter applying section 24 may, for example, have the same configuration as the jitter applying section 24 shown in FIG. 2. In this case, the jitter generating section 48 may, for example, output a phase control signal corresponding to the jitter of a first frequency component (for example, a low-frequency component) and output a delay control signal corresponding to the jitter of a second frequency component (for example, a high-frequency component). The jitter applying section 24 having this configuration can apply a combinational jitter obtained by combining a plurality of jitters having different frequency components from each other to the measurement signal.

Further, in the present example, the jitter applying section 24 may have the same configuration as the jitter applying section 24 shown in FIG. 3. In this case, the jitter generating section 64 may, for example, output a first jitter control signal corresponding to the jitter of a first frequency component (for example, a low-frequency component) and output a second jitter control signal corresponding to the jitter of a second frequency component (for example, a high-frequency component) different from the first frequency component. The jitter applying section 24 having this configuration can also apply a combinational jitter obtained by combining a plurality of jitters having different frequency components from each other to the measurement signal.

Yet further, in the present example, the jitter applying section 24 may have the same configuration as the jitter applying section 24 shown in FIG. 4 or FIG. 5. In this case, the jitter applying section 24 is supplied with a combinational jitter in the form of jitter data, and applies the jitter represented by the supplied jitter data to the measurement signal.

Furthermore, in the present example, the jitter applying section 24 may have the same configuration as a circuit, which includes a plurality of the jitter applying section 24 shown in FIG. 4 or FIG. 5, which are arranged in series. In this case, the plurality of jitter applying sections 24 are supplied with a plurality of jitters having different frequency components from each other respectively, in the form of jitter data.

Then, the plurality of jitter applying sections 24 apply the jitters represented by the supplied jitter data to the measurement signal respectively.

The signal supplying section 26 supplies the measurement signal to which the combinational jitter has been applied to the device under test 200; The signal creating section 82 having such a configuration can supply a measurement signal including a combinational jitter to the device under test 200.

The measuring section 84 receives a response signal which the device under test 200 outputs in response to the measurement signal, and measures the jitter transfer characteristic for the frequency component of each of the plurality of jitters. The measuring section 84 may, for example, include a jitter acquiring section 92 and a calculating section 94.

The jitter acquiring section 92 acquires the jitter included in the response signal output from the device under test 200 in response to the measurement signal supplied to the device under test 200. The jitter acquiring section 92 may, for example, include a level comparator circuit which converts the response signal to a logic level, and a timing detecting circuit which detects the timing (edge) at which the logic of the response signal switches. The timing detecting circuit may, for example, be a multi-strobe circuit which acquires the logic of the response signal at a plurality of timings which are staggered from each other by a minute time, and detects a timing at which the acquired logic switches.

The calculating section 94 stores the jitter of a predetermined time duration acquired by the jitter acquiring section 92 in a memory. Then, the calculating section 94 calculates the frequency characteristic of the jitter of the predetermined time duration stored in the memory. The calculating section 94 may, for example, perform FFT (Fast Fourier Transform) of the jitter of the predetermined time duration to calculate the frequency characteristic. Then, the calculating section 94 may calculate the jitter transfer characteristic at each frequency, based on the frequency characteristic of the combinational jitter which the jitter applying section 24 has applied to the measurement signal and the frequency characteristic of the jitter in the response signal. The measurement apparatus 80 having this configuration can analyze the jitter included in the response signal output from the device under test 200.

Although some aspects of the present invention have been described by way of exemplary embodiments, the technical scope of the present invention is not limited to the scope of disclosure by the above embodiments. Many changes and substitutions can be made upon the above embodiments. It is apparent from the appended claims that embodiments upon which such changes and substitutions are made can also be included in the technical scope of the present invention.

What is claimed is:

1. A measurement apparatus for measuring a jitter transfer characteristic of a device under test, comprising:
   a signal creating section which creates a measurement signal including a combinational jitter obtained by combining a plurality of jitters having different frequency components from each other, and supplies the measurement signal to the device under test; and
   a measuring section which receives a response signal which the device under test outputs in response to the measurement signal, and measures a jitter transfer characteristic for the frequency component corresponding to each of the plurality of jitters, wherein
   the signal creating section includes a jitter applying section which applies the combinational jitter to measurement signal, the jitter applying section including:
   a signal transmission path that transmits the measurement signal from an input terminal to an output terminal;
   a jitter control section that outputs a jitter control voltage corresponding to each of the plurality of jitters to be superimposed on the measurement signal;
   a variable capacitance diode that is provided between a connection node on the signal transmission path and the jitter control section, and whose capacitance changes according to the jitter control voltage output from the jitter control section;
   a buffer circuit that is connected in series on the signal transmission path closer to the input terminal than the connection node is, the buffer circuit receiving the measurement signal and outputting a voltage in response to the received measurement signal; and
   a serial resistor that is connected in series between the buffer circuit and the connection node on the signal transmission path.

2. The measurement apparatus as set forth in claim 1, further comprising:
   a plurality of variable capacitance diodes that are provided to correspond to a plurality of connection nodes on the signal transmission path respectively, each of the variable capacitance diodes being provided between a corresponding one of the connection nodes and the jitter control section;
   a plurality of buffer circuits that are provided to correspond to the plurality of connection nodes respectively, each of the buffer circuits being connected on the signal transmission path in series to be closer to the input terminal than a corresponding connection node is; and
   a plurality of serial resistors that are provided to correspond to the plurality of connection nodes respectively, each of the serial resistor being connected on the signal transmission path in series between a corresponding buffer circuit and a corresponding connection node.

3. The measurement apparatus as set forth in claim 2, further comprising:
   a plurality of noise eliminating sections that are provided to correspond to the plurality of variable capacitance diodes respectively, each of the noise eliminating sections eliminating noise occurring at an output terminal of the jitter control section caused by passing of the measurement signal through the corresponding variable capacitance diode.

4. The measurement apparatus as set forth in claim 3, wherein each of the plurality of noise eliminating sections includes:
   a noise eliminating resistor that is connected between a corresponding variable capacitance diode and the output terminal of the jitter control section; and
   a noise eliminating capacitor that is connected between the output terminal of the jitter control section and a reference potential.

5. The measurement apparatus as set forth in claim 2, further comprising:
   a selecting section that selects whether an input signal passes through the signal transmission path or a bypass transmission path that has a predetermined delay amount before being output.

6. The measurement apparatus as set forth in claim 5, wherein
   in passing an input signal by one of the signal transmission path and the bypass transmission path, the selecting section inputs a predetermined signal value to the other one of the signal transmission path and the bypass transmission path.

7. A measurement method for measuring a jitter transfer characteristic of a device under test, comprising:

creating a measurement signal including a combinational jitter obtained by combining a plurality of jitters having different frequency components from each other, and supplying the measurement signal to the device under test; and receiving a response signal which the device under test outputs in response to the measurement signal, and measuring a jitter transfer characteristic for the frequency component corresponding to each of the plurality of jitters, wherein said creating step includes applying the combinational jitter to the measurement signal, said applying step including:

transmitting the measurement signal through a signal transmission path from an input terminal to an output terminal;

outputting, from a jitter control section, a jitter control voltage corresponding to each of the plurality of jitters to be superimposed on the measurement signal;

changing the capacitance of a variable capacitance diode provided between a connection node on the signal transmission path and the jitter control section according to the jitter control voltage output from the jitter control section; and receiving, by a buffer circuit, the measurement signal and outputting a voltage in response to the received measurement signal, wherein the buffer circuit is connected in series on the signal transmission path closer to the input terminal than the connection node is and a serial resistor is connected in series between the buffer circuit and the connection node on the signal transmission path.

* * * * *